United States Patent
Dounaevski

(10) Patent No.: US 9,077,309 B2
(45) Date of Patent: Jul. 7, 2015

(54) SYSTEM AND METHOD FOR WIDEBAND HIGH CURRENT RF CHOKE NETWORK

(71) Applicant: Xtend Networks Ltd., Lod (IL)

(72) Inventor: Oleg Dounaevski, Hadera (IL)

(73) Assignee: Xtend Networks Ltd., Lod (IL)

(*) Notice: Subject to any disclaimer, the term of this patent is extended or adjusted under 35 U.S.C. 154(b) by 0 days.

(21) Appl. No.: 14/192,933

(22) Filed: Feb. 28, 2014

(65) Prior Publication Data

US 2014/0320235 A1    Oct. 30, 2014

Related U.S. Application Data

(63) Continuation of application No. 12/909,330, filed on Oct. 21, 2010, now abandoned.

(60) Provisional application No. 61/253,902, filed on Oct. 22, 2009.

(51) Int. Cl.
| | |
|---|---|
| *H03H 7/46* | (2006.01) |
| *H01F 27/42* | (2006.01) |
| *H03H 7/01* | (2006.01) |
| *H04N 7/10* | (2006.01) |

(52) U.S. Cl.
CPC ............ *H03H 7/46* (2013.01); *H01F 27/42* (2013.01); *H03H 7/461* (2013.01); *H04N 7/10* (2013.01); *H03H 7/1708* (2013.01)

(58) Field of Classification Search
CPC ......... H03H 7/19; H03H 1/0007; H03H 7/00; H03H 7/01; H03H 7/21; H03H 7/46; H03H 7/1708; H04N 7/10; H01F 27/42
USPC ........................... 333/12, 132, 175, 181
See application file for complete search history.

(56) References Cited

U.S. PATENT DOCUMENTS

| | | | | |
|---|---|---|---|---|
| 3,956,717 | A * | 5/1976 | Fisher et al. | 333/121 |
| 4,126,837 | A * | 11/1978 | Koyamada et al. | 333/193 |
| 5,430,418 | A * | 7/1995 | Blodgett | 333/100 |
| 5,483,208 | A * | 1/1996 | Spriester | 333/131 |
| 5,920,241 | A * | 7/1999 | Mazzochette | 333/174 |
| 6,339,364 | B1 * | 1/2002 | Reddy et al. | 333/181 |
| 6,703,910 | B1 * | 3/2004 | Lapushin | 333/181 |
| 7,479,856 | B2 * | 1/2009 | Asamura et al. | 333/204 |
| 7,944,305 | B2 * | 5/2011 | Knickerbocker et al. | 330/277 |

* cited by examiner

*Primary Examiner* — Benny Lee
*Assistant Examiner* — Rakesh Patel
(74) *Attorney, Agent, or Firm* — Pearl Cohen Zedek Latzer Baratz LLP

(57) ABSTRACT

A high current RF choke network comprising a high current RF choke combined with an all-pass T-bridge filter. The high current RF choke may be connected to a grounded capacitor in the serial branch of the all-pass filter. In this case the parasitic capacitance of the RF choke practically becomes an integral part of the all-pass filter capacitor. The added capacitance in parallel to the parasitic capacitance of the high current RF choke practically neutralizes the resonances of the high current RF choke and thus extends significantly the operating frequency range of the network. The operating frequencies bandwidth range of the high current RF choke network is extended from the legacy range of 5 MHz to 1 GHz up to an extended range of at least 5 MHz to 3 GHz.

9 Claims, 5 Drawing Sheets

SYSTEM AND METHOD FOR WIDEBAND HIGH CURRENT RF CHOKE NETWORK

CROSS-REFERENCE TO RELATED APPLICATIONS

This application is a continuation application of U.S. patent application Ser. No. 12/909,330, filed Oct. 21, 2010, which claims the benefit of U.S. Provisional Application Ser. No. 61/253,902, filed Oct. 22, 2009, all of which are hereby incorporated by reference in their entirety.

BACKGROUND OF THE INVENTION

A radio-frequency (RF) choke, commonly used in cable-television (CATV) networks, allow allows high alternating current (AC) of 10-20 A, 50-60 Hz to pass through, while keeping the impact on the RF transmission chain (such as CATV RF transmission chain) minimal. Such impact is defined by transmission and reflection losses in the RF frequency band of the network. The transmission and reflection losses should be kept substantially constant across the working frequency band of the network. In other words, the transmission and reflection losses should have substantially flat response curve. These response curves should ideally be kept substantially flat for any bandwidth extension within the desired working range of frequencies.

CATV networks typically distribute RF signals in the legacy 5 MHz to 1 GHz range. Prior art high current RF chokes used for these networks typically resonate at frequencies just above 1 GHz. This phenomenon limits the operating frequency of these chokes to about 1 GHz.

A currently available method for frequency bandwidth extension of high current RF chokes includes sophisticated wounding of copper wire on a special constructed ferrite core with special properties. This method can extend the working frequency range up to 1.4 GHz when copper wire having diameter of 1.5 mm is used.

Another solution involves using a low pass filter for blocking RF signals above 1 GHz from getting to the RF choke as described for example in U.S. Pat. No. 7,138,886. Implementing the second method can achieve much higher frequencies but requires diplexer with low pass and high pass filters. The design of such systems requires keeping some guard-band frequencies unusable and tuning of such diplexers is complicated and expensive.

SUMMARY OF THE INVENTION

According to embodiments of the present invention, a wideband high current RF choke is disclosed WITH operating frequencies bandwidth range extended from the legacy range of 5 MHz to 1 GHz up to an extended range of at least 5 MHz to 3 GHz. A high current RF choke arrangement according to embodiments of the invention consists of high current RF choke of the types that are already in use in CATV networks, combined with an all-pass T-bridge type filter. An all-pass filter connected to the legacy RF choke may be designed to eliminate the negative effect of resonance frequencies in order to allow a substantially flat response curve for RF signals in the extended operating range.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
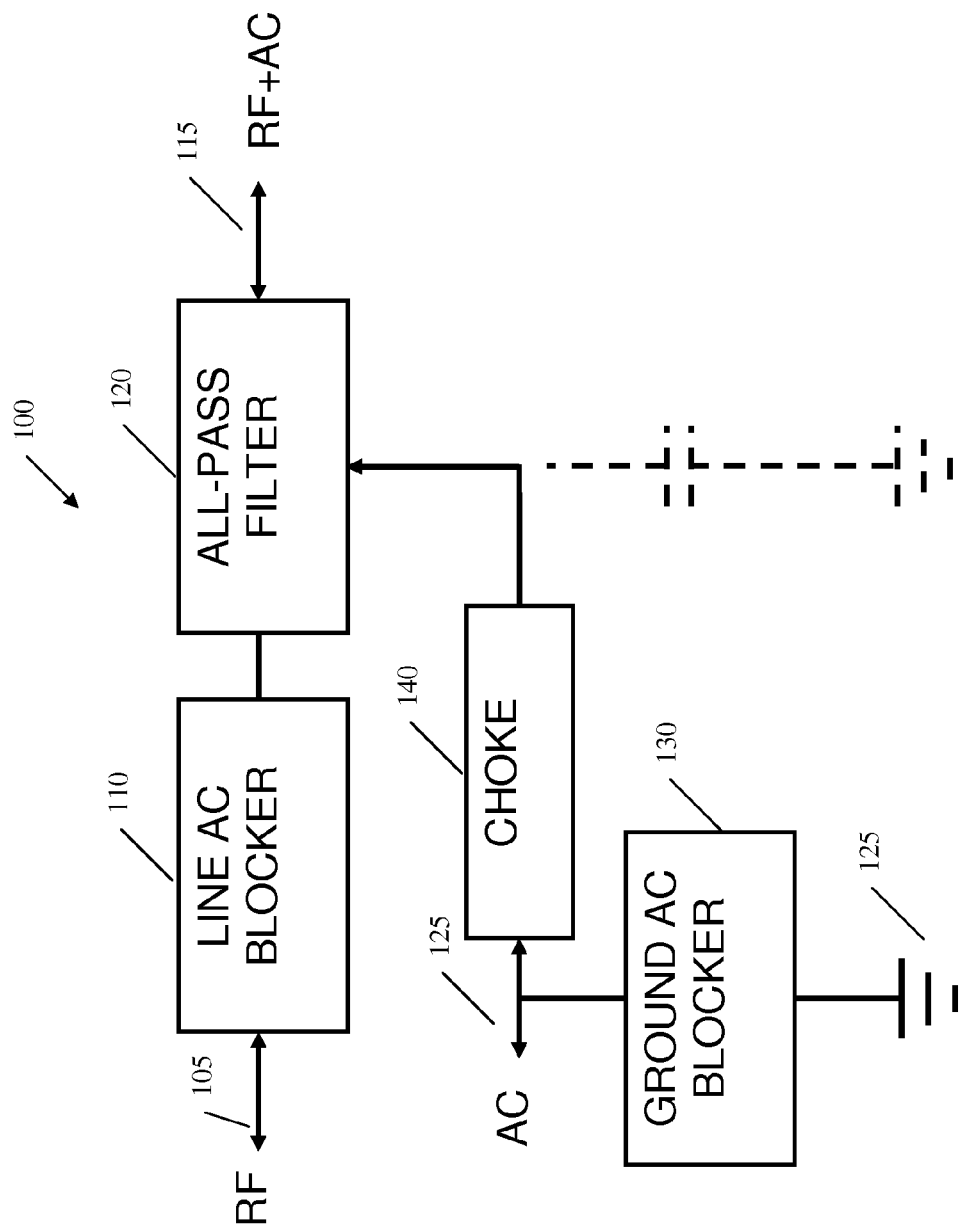
FIG. 1 is a schematic functional block diagram of an AC current inserter comprising a high current RF choke network according to embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Although a portion of the discussion may relate to CATV AC current inserter, systems, and methods, the present invention is not limited in this regard, and embodiments of the present invention may be used for various other applications such as splitters, couplers, taps and the similar.

According to embodiments of the present invention, a wideband high current RF choke is disclosed where the operating frequencies bandwidth range is extended from the legacy range of 5 MHz to 1 GHz up to an extended range of, for example, at least 5 MHz to 3 GHz. A high current RF choke arrangement according to embodiments of the invention consists of high current RF choke that is already in use in CATV networks combined with an all-pass T-bridge filter. Opposite of a low pass filter or other limited band filters, an ideal all-pass filter has no cut-off frequency. The bandwidth of a practical all-pass filter, however, is limited by parasitic values of its elements. According to embodiments of the present invention, the high current RF choke may be connected to a grounded capacitor in the serial branch of the all-pass filter. In this case the parasitic capacitance of the RF choke practically becomes an integral part of the all-pass filter capacitor, considering that the parasitic capacitance of the RF choke, which may have a value of about 1 pF, may have a considerable effect on the all-pass filter in the frequency range nearby the resonance frequency of the all-pass filter. The added capacitance in parallel to the parasitic capacitance of the high current RF choke practically neutralizes the resonances of the high current RF choke and thus extends significantly the operating frequency range of the arrangement in the embodiment of the presented invention, as will be explained in detail below.

Reference is now made to FIG. 1 which presents a schematic functional block diagram of an AC current inserter 100 comprising a high current RF choke network according to embodiments of the invention. According to embodiments of the present invention, RF signal may flow from RF input/output port 105 through line AC blocker 110 and all pass filter 120 to RF+AC port 115. RF signal may also flow in the opposite direction, i.e. from RF+AC port 115 through all pass filter 120 and line AC blocker 110 to RF input/output port 105. The RF signal may not flow to AC input port 125 because the arrangement of choke 140 and ground AC blocker 130 substantially blocks the RF signal from arriving at AC input port 125. Ground AC blocker 130 substantially grounds choke 140 in the RF signal frequency range, at the end distant from the RF signals and close to AC input port 125.

An AC signal of, typically but not limited to, 10-20 A, 50-60 Hz, may flow from AC input port 125 through choke 140 and all pass filter 120 to RF+AC port 115. The AC signal is prevented from flowing into RF input/output port 105 by line AC blocker 110. AC input port 125 is not grounded at the AC frequency range as AC signals are blocked from flowing to the ground node by ground AC blocker 130.

The serial branch of all pass filter 120 and choke 140 may be connected in parallel to the parasitic capacitance of choke 140 such that in practice the equivalent capacitance value of the grounded capacitor of the serial branch of all-pass filter 120 may substantially equal the sum of the grounded capacitor of the serial branch of all-pass filter 120 and the parasitic capacitance of choke 140 (schematically presented with a grounded capacitor in dashed line. The added capacitance in parallel to the parasitic capacitance of the choke 140 practically neutralizes the resonances of the choke 140 and thus extends significantly the operating frequency range of the arrangement in the embodiment of the presented invention.

Figure 2:
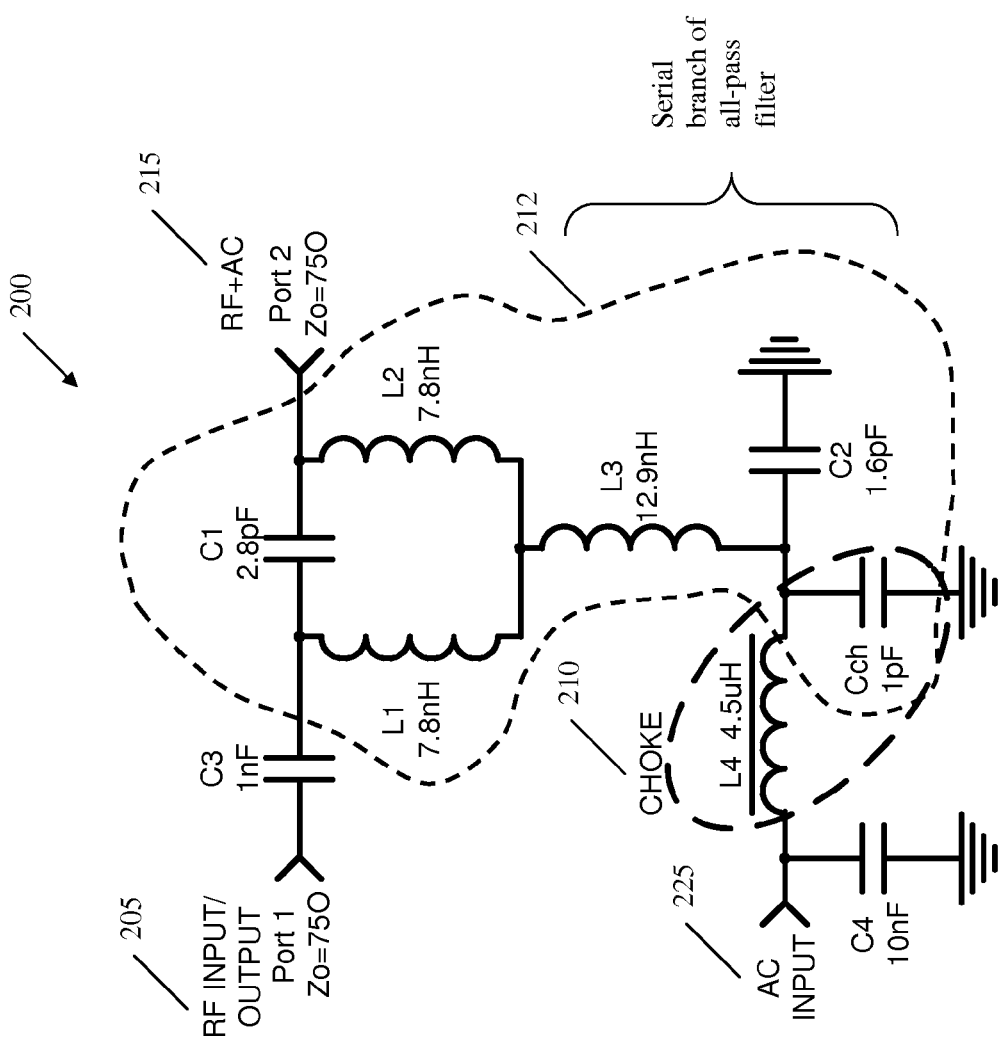
FIG. 2 is a schematic illustration of a basic AC current inserter comprising a high-current extended frequency RF choke according to embodiments of the present invention.

Reference is now made to FIG. 2 which presents a schematic illustration of a basic AC current inserter 200 comprising a high-current extended frequency RF choke according to embodiments of the present invention. This embodiment is an exemplary realization of functional block diagram 100. AC current inserter 200 consists of RF choke 210 combined with an all-pass filter 212 and two AC blockers C3 and C4. Choke 210 may be represented by an equivalent circuit comprising inductor L4 and capacitor Cch which represents the parasitic capacitance of choke 210. All pass filter 120 of FIG. 1 is realized as a T-bridged filter 212 comprising inductors L1, L2 and L3 and capacitors C1, C2 and Cch. Line AC blocker 110 is realized by capacitor C3 and ground AC blocker 130 is realized by capacitor C4.

According to the exemplary embodiment presented in FIG. 2, a first end of capacitor C3 may be connected to RF input/output port 205 and the second end of capacitor C3 may be connected to a first end of capacitor C1 and to a first end of inductor L1 of the all pass filter. A second end of capacitor C1 may be connected to RF+AC port 215 and to a first end of inductor L2. The second ends of inductors L1 and L2 may be connected to each other and to a first end of inductor L3. A second end of L3 may be connected to a first end of capacitor C2, to a first end of choke 210. Parasitic capacitance Cch may be considered as connected to the first end of choke 210. A second end of choke 210 may be connected to AC input port 225 and to a first end of capacitor C4. The second ends of capacitors C2 and C4 may be grounded.

Capacitor C2 of the serial branch of the all-pass filter 212 may be connected in parallel to parasitic capacitance Cch of choke 210 such that in practice the equivalent capacitance value of the grounded capacitor of the serial branch of the all-pass filter 212 may equal substantially C2+Cch. The resonance frequency $\omega_0$ of all-pass filter 212 may be substantially determined by the inductance values of L1 and L2 and the capacitance values of C1, or by the inductance value of L3 and the capacitance of the equivalent capacitor Cr=C2+Cch, according to Formula 1:

$$\omega_0 = \frac{1}{\sqrt{(L1*C1)}} = \frac{1}{\sqrt{L3(C2+Cch)}} \qquad \text{[Formula 1]}$$

For proper operation of the all-pass filter 212, L1 should equal L2 and the center and right side of Formula 1 should be equal or have close values. It is desirable to have the resonance frequency of all-pass filter 212 at the range of 500-900 MHz. For example, in the embodiment presented in FIG. 2 the resonance frequency of the all pass filter 212 is around 800 MHz.

Another consideration in the choice of the resonance frequency of all-pass filter 212 is that the effect of the parasitic capacitance Cch of choke 210 must be sufficiently shunted by the value of capacitor C2 to substantially prevent and eliminate the resonances of choke 210. However, Cch+C2 may be together part of all-pass filter 212 and may contribute to determining the resonance frequency of all-pass filter 212. The active loss of choke 210 around the resonance frequency of all-pass filter 212 causes additional insertion loss of 0.2-0.4 db in the band around the resonance frequency of all-pass filter 212, depending on choke 210 quality.

Choke 210 is represented by equivalent circuit comprising capacitance Cch, which may have a capacitance of, for example, about 1 pF in some embodiments, and inductor L4 with inductance of, for example, 4.5 uH that may cause some additional active losses at the resonance frequency of the all-pass filter. Other values of capacitor Cch and of inductor L4 may be used to satisfy the requirements on $\omega_0$ defined above. $\omega_0$ may equal $2*\pi*f$ while f ranges from, for example, 500 to 900 MHZ.

An AC signal which is provided to AC input port 225 may substantially flow through inductors L4, L3 and L2 to RF+AC port 215. Inductors L2 and L3 may be designed to bear high current, for example, AC signals of, typically but not limited to, 10-20 A, 50-60 Hz, and may be implemented, for example, with windings of copper wire having a diameter of at least 1 mm, formed as continued double coil with a tap for coil L1. Other implementations of inductors L2 and L3 that bear high AC signals may be utilized. Inductor L1 need not to bear AC signals and may be implemented, for example, using windings of copper wire having diameter of about 0.5 mm for the purpose of reduction of stray capacitance to ground. Other implementations of inductor L1 may be utilized.

RF signal may be provided through RF input/output port 205 and flow through capacitors C3 and C1 to RF+AC port 215. RF signal may also be provided through RF+AC port 215 and flow through capacitors C1 and C3 to RF input/output port 205.

High voltage blocking capacitors C3 and C4 may have capacitance values in the range of 0.33-10 nF. For example, in the embodiment presented in FIG. 2, capacitor C3 has capacitance of 1 nF and capacitor C4 has capacitance of 10 nF. Capacitor C3 may be used to block the flow of AC signal to RF input/output port 205 and to improve return loss at frequencies near 5 MHz. Capacitor C4 may be used to block the AC signal from flowing to the ground while shorting RF signals to ground.

Figure 3:
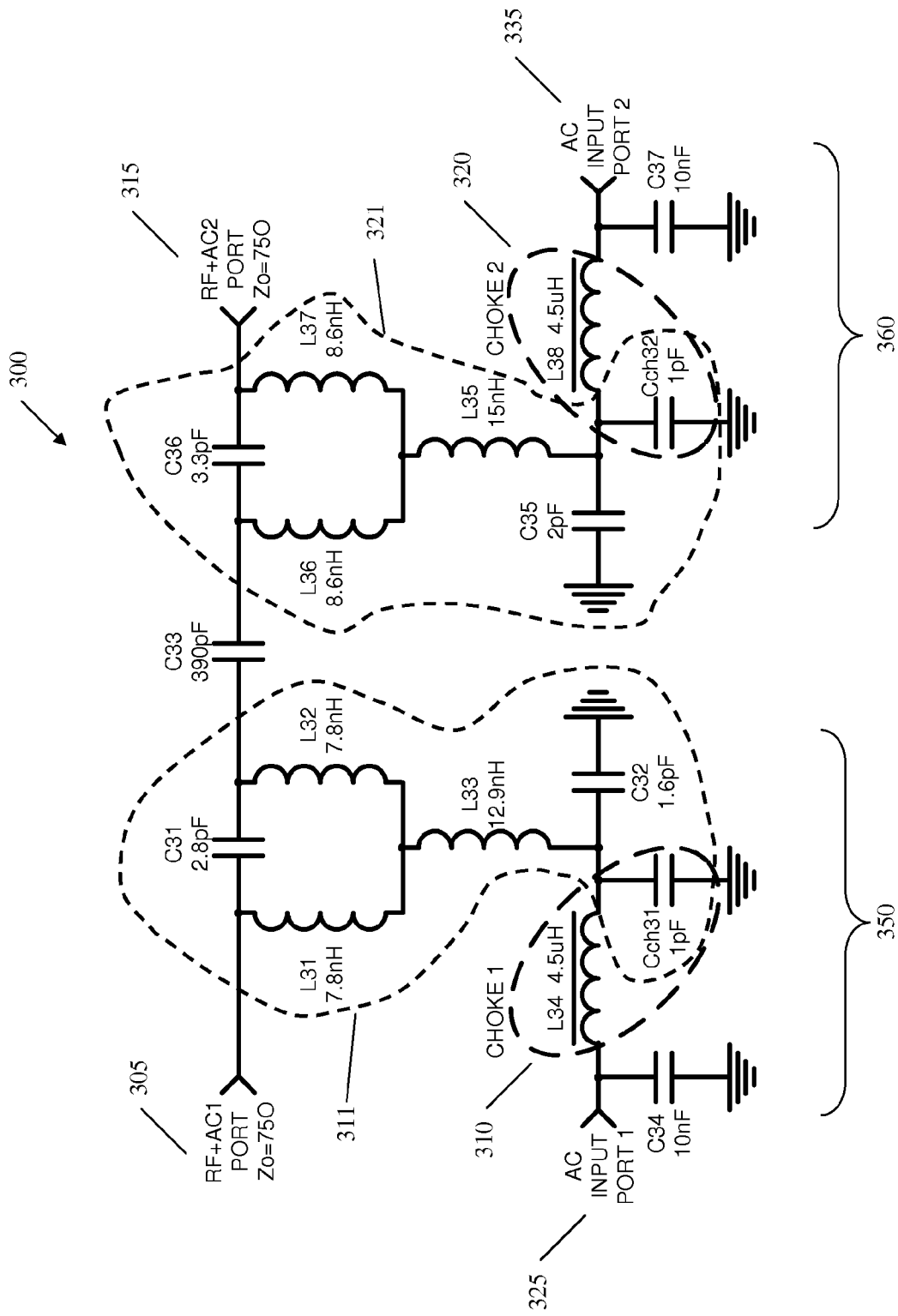
FIG. 3 is a schematic illustration of a dual AC current inserter comprising two high-current extended frequency RF chokes according to embodiments of the present invention.

Reference is now made to FIG. 3 which presents a schematic illustration of a dual AC current inserter 300 comprising two high-current, extended frequency RF chokes according to embodiments of the present invention. This embodiment is an exemplary realization of functional block diagram 100 modified to enable two AC input ports 325 and 335. Dual AC current inserter 300 has two main branches, left branch 350 and right branch 360. Each branch consists of an RF choke 310, 320 combined with all-pass filter 311, 321 and a ground AC blocker capacitor C34, C37. A common line AC blocker, realized by capacitor C33, prevents AC signal from one branch (350 or 360) from flowing to the other branch. Choke 310 of left branch 350 is represented by an equivalent circuit comprising inductor L34 and capacitor Cch31 which may represent the parasitic capacitance of choke 310. All-pass filter 120 of FIG. 1 of left branch 350 is realized as a T-bridged filter 311 comprising inductors L31, L32 and L33 and capacitors C31, C32 and Cch31. Ground AC blocker 130 of FIG. 1 of left branch 350 is realized by capacitor C34. Choke 320 of right branch 360 is represented by an equivalent circuit comprising inductor L38 and capacitor Cch32. Capacitor Cch32 may represent parasitic capacitance of choke 320. All-pass filter 120 of FIG. 1 implemented in right branch 360 is realized as a T-bridged filter 321 comprising inductors L36, L37 and L35 and capacitors C36, C35 and Cch32. Ground AC blocker 130 of FIG. 1 is realized by capacitor C37.

According to the exemplary embodiment presented in FIG. 3, a first end of capacitor C31 may be connected to RF input/output port 305 and to a first end of inductor L31, and the second end of capacitor C31 may be connected to a first end of capacitor C33 and to a first end of inductor L32. The second ends of inductors L31 and L32 may be connected to each other and to a first end of inductor L33. The second end of inductor L33 may be connected to a first end of capacitor C32 and to a first end of choke 310. Parasitic capacitance Cch31 may be considered as connected to the first end of choke 310. The second end of choke 310 may be connected to AC input port 1 325 and to a first end of capacitor C34. The second ends of capacitors C32 and C34 may be grounded.

The second end of capacitor C33 may be connected to a first end of capacitor C36 and to a first end of inductor L36. The second end of capacitor C36 may be connected to a first end of inductor L37. The second ends of inductors L36 and L37 may be connected to each other and to a first end of inductor L35. The second end of inductor L35 may be connected to a first end of capacitor C35 and to a first end of choke 320. Parasitic capacitance Cch32 may be considered as connected to the first end of choke 350. The second end of choke 320 may be connected to AC input port 2 335 and to the first end of capacitor C37. The second ends of capacitors C35 and C37 may be grounded.

Dual AC current inserter 300 may be used as an AC current inserter with dual AC input ports 325 and 335. In practice, only one input port may be active at any given time. This arrangement enables additional flexibility in the field and eliminates the need to have two different versions of the AC current inserters, one with AC input port at its right hand side and the other with AC input port at its left hand side. The field technician may connect an AC source either at the right hand side or at the left hand side of a single device, at his choice.

An AC signal may be inputted either from AC input port 1 325 of left branch 350 or from AC input port 2 335 of right branch 360. In case AC signal is provided through AC input port 1 325, this AC signal substantially flows through inductors L34, L33 and L31 to RF+AC1 port 305. Capacitor C33 substantially blocks this AC signal to prevent it from flowing to RF+AC2 port 315. In case AC signal is provided through AC input port2 335, this AC signal substantially flows through inductors L38, L35 and L37 to RF+AC2 port 315. Capacitor C33 substantially blocks this AC signal to prevent it from flowing to RF+AC1 port 305.

RF signal may either be provided through RF+AC1 port 305 and flow through capacitors C31, C33 and C36 to RF+AC2 port 315, or RF signal may be provided through RF+AC2 port 315 and flow through C36, C33 and C31 to RF+AC1 port 305, regardless of the active AC input port.

High voltage blocking capacitor C33 may have capacitance values in the range of 330-470 pF. For example, in the embodiment presented in FIG. 3, C3 has capacitance of 390 pF. Blocking capacitor C33 also provides compensation to get return loss below −17 db at 5 MHz and higher frequencies.

Considerations for selecting the other various components for dual AC current inserter 300 are basically similar to that of AC current inserter 200. However, it is desirable to have different resonance frequency for all pass filters 311 and 321 at each branch. For example, in the embodiment presented in FIG. 3, the resonance frequency of the all pass filter 311 of left branch 350 is about 850 MHz and the resonance frequency of the all pass filter 321 of right branch 360 is about 650 MHz. Other resonance frequencies in the range of 500-900 MHz for all pass filters 311 and 321 may be chosen.

The resonance frequency $\omega_{0left}$ of the left branch 350 all-pass filter 311 may substantially be determined by the inductance values of L31 with the capacitance values of C31 or by L33 with equivalent capacitor $Cr_{left}$=C32+Cch31 according to Formula 2:

$$\omega_{0left} = \frac{1}{\sqrt{L31 * C31}} = \frac{1}{\sqrt{L33(C32 + Cch_{31})}} \quad \text{[Formula 2]}$$

The resonance frequency $\omega_{0right}$ of the right branch 360 all-pass filter 321 may substantially be determined by the inductance values of L36 with the capacitance values of C36 or by L35 with equivalent capacitor $Cr_{right}$=C35+Cch32 according to Formula 3:

$$\omega_{0right} = \frac{1}{\sqrt{L36 * C36}} = \frac{1}{\sqrt{L35(C35 + Cch_{32})}} \quad \text{[Formula 3]}$$

High voltage blocking capacitors C34 and C37 may have capacitance values in the range of 6.8-22 nF. For example, in the embodiment presented in FIG. 3, C34 and C37 have capacitance of 10 nF. C34 and C37 may be used to substantially block the AC signal while shorting RF path to ground.

Inductors L31, L33, L35 and L37 may be designed to bear high current, for example, AC signals of, typically but not limited to, 10-20 A, 50-60 Hz, and may be implemented, for example, with windings of copper wire having diameter of at least 1 mm, formed as continued double coil with a tap for the third coil of the all pass filter. Other implementations of inductors L31, L33, L35 and L37 that bear high AC signals may be utilized. Inductors L32 and L36 need not to bear AC signal and may be implemented, for example, using windings of about 0.5 mm copper wire for the purpose of reduction of stray capacitance to ground. Other implementations of inductors L32 and L36 may be utilized.

Figure 4:
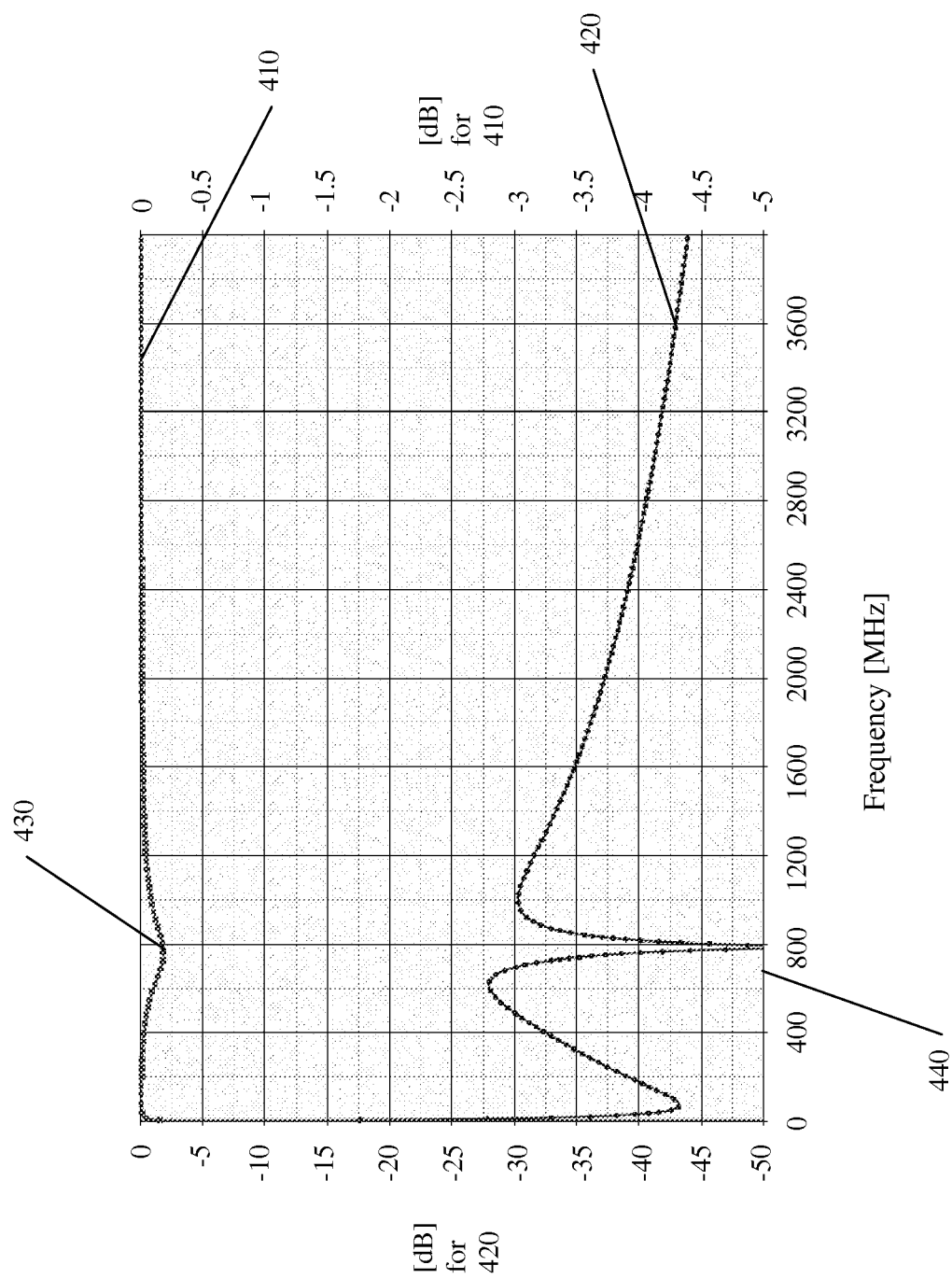
FIG. 4 is a schematic illustration of simulated frequency response for insertion and reflection losses of ideal all-pass filter combined with choke.

FIG. 4 shows schematic illustration of simulated frequency response for insertion and reflection losses of the all-pass filter 212 of AC current inserter 200 combined with choke 210 that is presented as low-Q inductor of 4.5 uH and capacitor of 1 pF. The components of the all-pass filter 212 of AC current inserter 200 were assumed to be ideal i.e. without parasitic elements.

The frequency response of forward RF transmission loss 410 of AC current inserter 200 was substantially less than 2 dB for the desired frequency band of 5 MHz to 3 GHz and beyond. Small losses 430, less than −0.5 dB, can be seen around the resonance frequency of the all pass filter, at frequency of about 800 MHz.

The frequency response of return loss 420 of AC current inserter 200 has the shape of double increase from each side of its resonance frequency 440 at frequency of about 800 MHz. T-bridged all-pass filter may have a pair of complex conjugate transmission zeros in the open right half-plane of the complex plane that permits cascaded implementation. As the return loss values are very low, this phenomenon is practically negligible.

In the applications of embodiments of the current invention for CATV networks as splitters, couplers, power inserters, taps and the similar, high current RF chokes and all-pass filters may be situated at the inputs and outputs of the devices. To ensure that each cascaded all-pass filter section does not cause accumulating undesired effects on each-other due to resonating in close frequencies and that insertion loss of each of the chokes does not accumulate at the same frequency band, it is recommended to have the resonance frequency of the all-pass filters at the inputs of the various devices different from the resonance frequency of the all-pass filters at the outputs of the various devices. The resonance frequency of the all-pass filters of all outputs across the various devices may be the same, as the structure and functional properties of those devices assume isolation between all outputs. Proper choice of the distance between resonance frequencies of the all-pass filters at the inputs and outputs is important for robust design and tuning of the devices.

Figure 5:
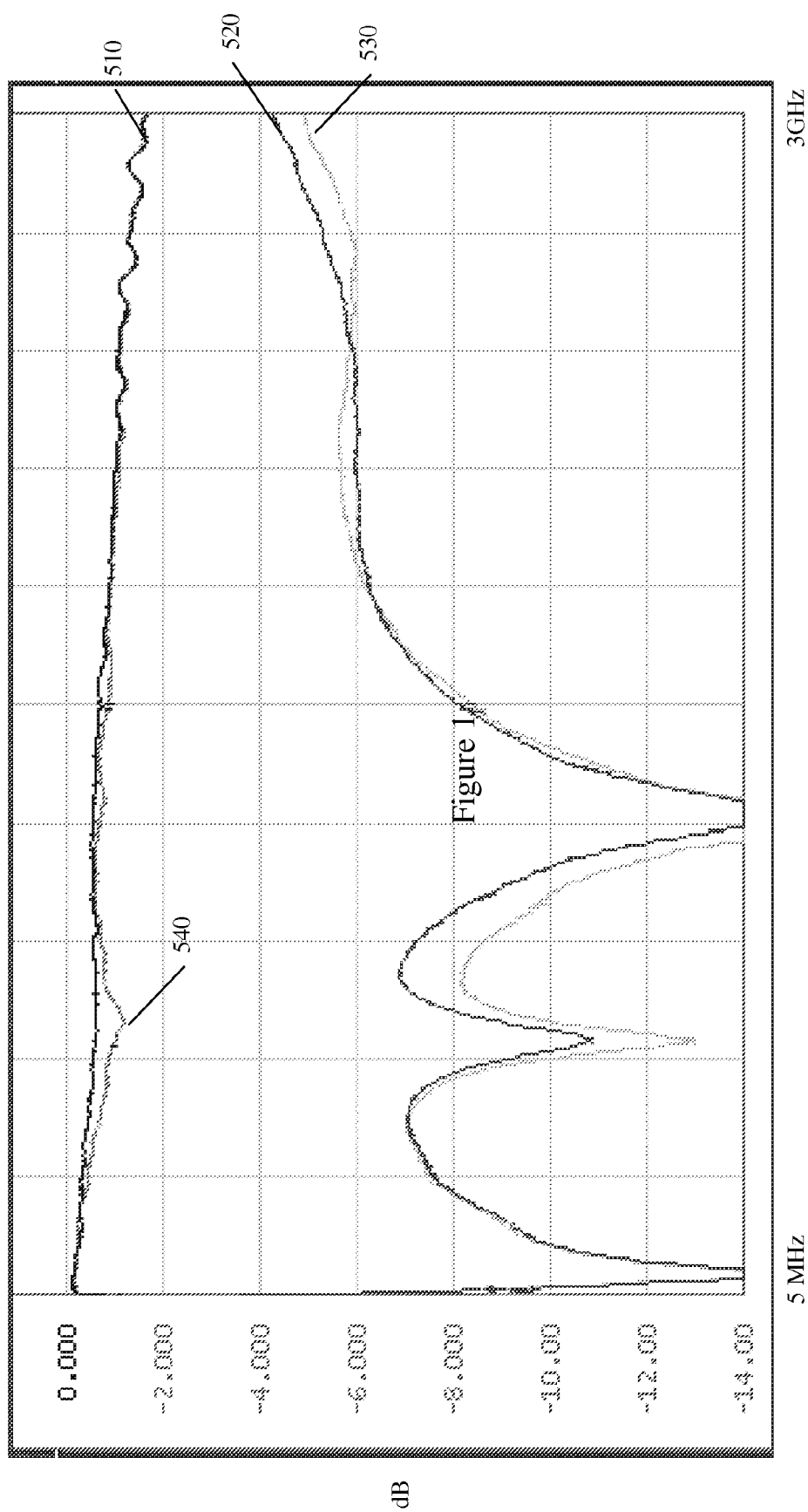
FIG. 5 is a schematic illustration of measured frequency responses of realization of an AC current inserter according to embodiments of the invention without a blocking capacitor, for different chokes.

Reference is now made to FIG. 5 which shows a schematic illustration of the measured frequency responses of realization of AC current inserter 200 without blocking capacitor C3 for different chokes with high and low active losses. Presented are forward RF transmission loss curves 510,540, return RF transmission loss curve 520 in case RF flows from RF input/output port 205 to RF+AC port 215, and return RF transmission loss in case RF signals flow in the opposite direction curve 530.

RF transmission loss curve 540 relates to a realization of AC current inserter 200 comprising a choke 210 with higher active losses in comparison to the choke 210 of AC current inserter 200 of RF transmission loss curve 510. Both chokes have inductance of 2.5 uH thus compensation at 5 MHz may not be realizable. When two chokes in parallel are implemented as shown on FIG. 3, capacitor of 390 pF gives return loss below −17 dB at 5 MHz.

One can see that return RF transmission loss 520 curve shape is very similar of that simulated return loss 420. Return RF transmission loss 520 curve loses this distinctive shape after reduction of return loss below −18 dB.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A high current RF choke network comprising:
an RF port;
a first AC input port;
a first RF and AC port;
a first ground AC blocker connected to the first AC input port at one end and to ground on the other end, the first ground AC blocker configured to block an AC signal and configured to short circuit an RF signal to ground;
a first choke connected to the first AC input port and the first ground AC blocker on one end, the first choke configured to enable the AC signal to flow through the first choke from the first AC input port and configured to block the RF signal;
a line AC blocker connected to the RF port at a first end, the line AC blocker configured to prevent the AC signal from flowing to the RF port; and
a first all pass filter connected to a second end of the line AC blocker, connected to a second end of the first choke and connected to the first RF and AC port, the first all pass filter configured to pass the RF signal between the first RF and AC port and the RF port, configured to pass the AC signal from the first choke to the first RF and AC port, and configured to neutralize resonance of the first choke in the frequency range of 5 MHz to 3 GHz.

2. The network of claim 1, wherein the first all pass filter is a T-bridged all pass filter.

3. The network of claim 2, wherein the first all pass filter comprises a serial branch including a capacitor; and the capacitor of the serial branch of the first all pass filter is connected in parallel to a parasitic capacitance of the first choke.

4. The network of claim 1, wherein the AC signal comprises a current no more than 20 A and a frequency between 50 to 60 Hz.

5. The network of claim 1, the frequency range of the RF signal is at least 5 MHz to 3000 MHz.

6. The network of claim 1, further comprising:
a second RF and AC port;
a second AC input port;
a second ground AC blocker connected to the second AC input port at one end, and to ground on the other end, the second ground AC blocker configured to block a second AC signal and configured to short circuit the RF signal to ground;
a second choke connected to the second AC input port and the second ground AC blocker on one end, the second choke configured to enable the second AC signal to flow through the second choke from the second AC input port and configured to block the RF signal; and
a second all pass filter connected at the first end of the line AC blocker, connected to a second end of the second choke and connected to the second RF and AC port; the second all pass filter configured to pass the RF signal between the second RF and AC port and the RF port, configured to pass the second AC signal from the second choke to the second RF and AC port, and configured to neutralize resonance of the second choke in the frequency range of 5 MHz to 3 GHz.

7. The network of claim 6, wherein the first all pass filter and the second all pass filter are T-bridged all pass filters.

8. The network of claim 7, wherein the first all pass filter and the second all pass filter each comprise a serial branch including a capacitor; the capacitor of the serial branch of the first all pass filter is connected in parallel to a parasitic capacitance of the first choke and the capacitor of the serial branch of the second all pass filter is connected in parallel to a parasitic capacitance of the second choke.

9. The network of claim 6, wherein the resonance frequency of the first all pass filter is different from the resonance frequency of the second all pass filter.

* * * * *